(12) United States Patent
Wu et al.

(10) Patent No.: US 8,518,753 B2
(45) Date of Patent: Aug. 27, 2013

(54) ASSEMBLY METHOD FOR THREE DIMENSIONAL INTEGRATED CIRCUIT

(75) Inventors: Chih-Wei Wu, Zhuangwei Township (TW); Szu Wei Lu, Hsin-Chu (TW); Jing-Cheng Lin, Hsin-Chu (TW); Shin-Puu Jeng, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/296,922

(22) Filed: Nov. 15, 2011

(65) Prior Publication Data
US 2013/0122659 A1    May 16, 2013

(51) Int. Cl.
*H01L 21/00* (2006.01)

(52) U.S. Cl.
USPC .......................... 438/126; 257/784

(58) Field of Classification Search
USPC .......................... 438/126; 257/784
See application file for complete search history.

(56) References Cited

U.S. PATENT DOCUMENTS

| | | | |
|---|---|---|---|
| 4,811,082 A | 3/1989 | Jacobs et al. | |
| 4,990,462 A | 2/1991 | Sliwa, Jr. | |
| 5,075,253 A | 12/1991 | Sliwa, Jr. | |
| 5,380,681 A | 1/1995 | Hsu | |
| 5,481,133 A | 1/1996 | Hsu | |
| 6,002,177 A | 12/1999 | Gaynes et al. | |
| 6,180,881 B1 * | 1/2001 | Isaak | 174/524 |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,355,501 B1 | 3/2002 | Fung et al. | |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,504,241 B1 * | 1/2003 | Yanagida | 257/686 |
| 6,562,653 B1 | 5/2003 | Ma et al. | |
| 6,570,248 B1 | 5/2003 | Ahn et al. | |
| 6,600,222 B1 | 7/2003 | Levardo | |
| 6,607,938 B2 | 8/2003 | Kwon et al. | |
| 6,661,085 B2 | 12/2003 | Kellar et al. | |
| 6,762,076 B2 | 7/2004 | Kim et al. | |
| 6,790,748 B2 | 9/2004 | Kim et al. | |
| 6,887,769 B2 | 5/2005 | Kellar et al. | |
| 6,908,565 B2 | 6/2005 | Kim et al. | |
| 6,908,785 B2 | 6/2005 | Kim | |
| 6,924,551 B2 | 8/2005 | Rumer et al. | |
| 6,943,067 B2 | 9/2005 | Greenlaw | |
| 6,946,384 B2 | 9/2005 | Kloster et al. | |
| 6,975,016 B2 | 12/2005 | Kellar et al. | |
| 7,037,804 B2 | 5/2006 | Kellar et al. | |
| 7,056,807 B2 | 6/2006 | Kellar et al. | |

(Continued)

*Primary Examiner* — Jarrett J Stark
*Assistant Examiner* — John M Parker
(74) *Attorney, Agent, or Firm* — Slater & Matsil, L.L.P.

(57) ABSTRACT

A method comprises attaching a first side of an interposer on a carrier wafer. The first side of the interposer comprises a plurality of bumps. The carrier wafer comprises a plurality of cavities formed in the carrier wafer. Each bump on the first side of the interposer can fit into its corresponding cavity on the carrier wafer. Subsequently, the method comprises attaching a semiconductor die on the second side of the interposer to form a wafer stack, detaching the wafer stack from the carrier wafer and attaching the wafer stack to a substrate.

20 Claims, 12 Drawing Sheets

(56) References Cited

U.S. PATENT DOCUMENTS

| | | |
|---|---|---|
| 7,087,538 B2 | 8/2006 | Staines et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,834,450 B2 | 11/2010 | Kang |
| 8,067,268 B2 * | 11/2011 | Carson et al. ............ 438/109 |
| 8,324,513 B2 * | 12/2012 | Horiuchi et al. .......... 174/262 |

* cited by examiner

ASSEMBLY METHOD FOR THREE DIMENSIONAL INTEGRATED CIRCUIT

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-20 nm node). As the demand for miniaturization, higher speed and greater bandwidth, as well as lower power consumption and latency has grown recently, there has grown a need for smaller and more creative packaging techniques of semiconductor dies.

As semiconductor technologies evolve, multi-chip wafer level package based semiconductor devices have emerged as an effective alternative to further reduce the physical size of a semiconductor chip. In a wafer level package based semiconductor device, active circuits such as logic, memory, processor circuits and the like are fabricated on different wafers and each wafer die is stacked on top of another wafer die using pick-and-place techniques. Much higher density can be achieved by employing multi-chip semiconductor devices. Furthermore, multi-chip semiconductor devices can achieve smaller form factors, cost-effectiveness, increased performance and lower power consumption.

A three-dimensional (3D) integrated circuit (IC) may comprise a top active circuit layer, a bottom active circuit layer and a plurality of inter-layers. In a 3D IC, two dies may be bonded together through a plurality of bumps and electrically coupled to each other through a plurality of through vias. The bumps and through vias provide an electrical interconnection in the vertical axis of the 3D IC. As a result, the signal paths between two semiconductor dies are shorter than those in a traditional 3D IC in which different dies are bonded together using interconnection technologies such as wire bonding based chip stacking packages. A 3D IC may comprise a variety of semiconductor dies stacked together. The multiple semiconductor dies are packaged before the wafer has been diced. The wafer level package technology has some advantages. One advantageous feature of packaging multiple semiconductor dies at the wafer level is multi-chip wafer level package techniques may reduce fabrication costs. Another advantageous feature of wafer level package based multi-chip semiconductor devices is that parasitic losses are reduced by employing bumps and through vias.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, a carrier wafer having a plurality of cavities to provide a support, which holds a semiconductor wafer stack during a three dimensional (3D) integrated circuit (IC) fabrication process. The embodiments of the present disclosure may also be applied, however, to a variety of semiconductor fabrication processes.

Figure 1:
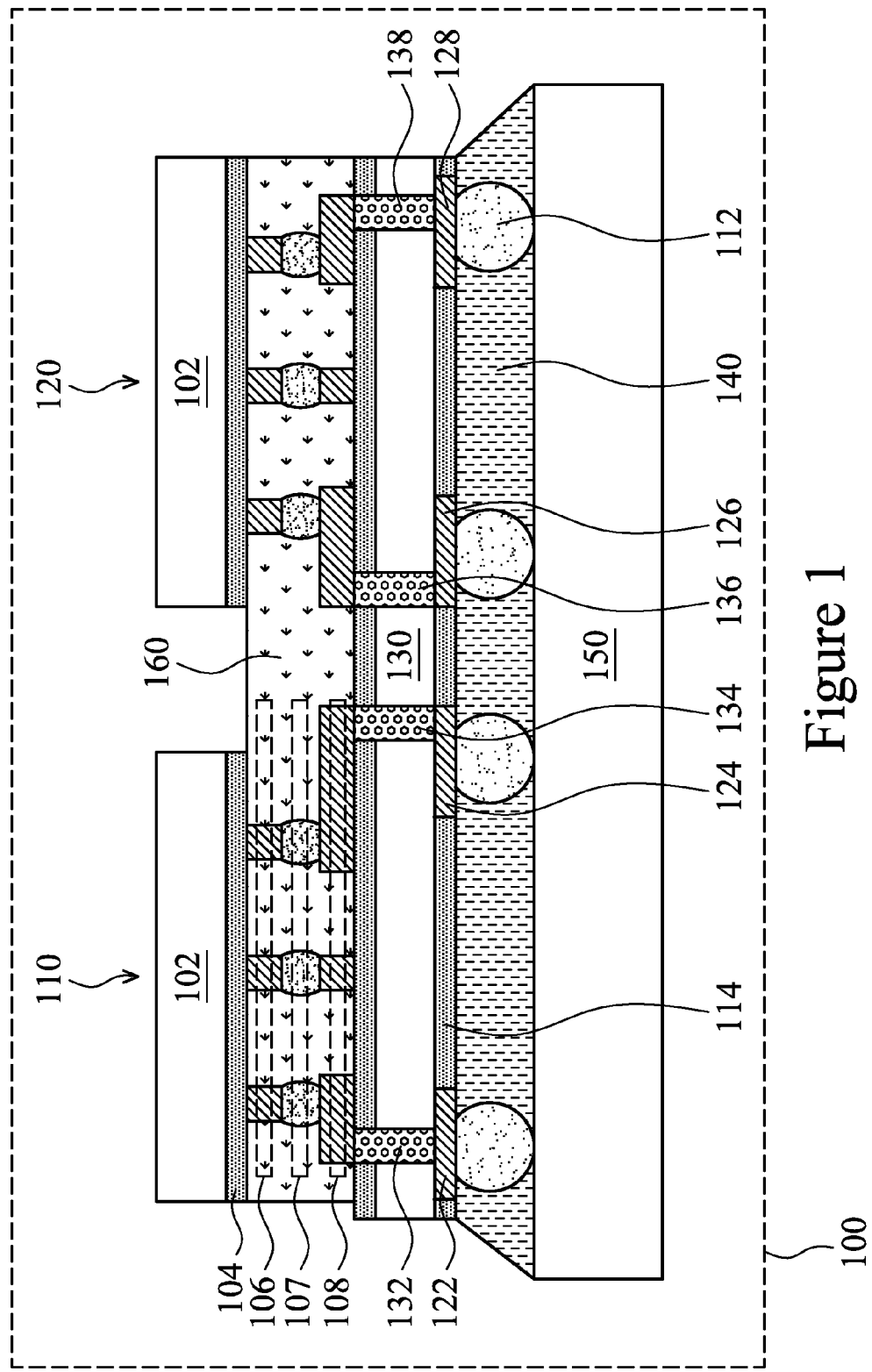
FIG. 1 illustrates a cross sectional view of a wafer stack in accordance with an embodiment.

Referring initially to FIG. 1, a cross sectional view of a wafer stack is illustrated in accordance with an embodiment. The wafer stack 100 includes a substrate 150, an interposer 130, a first semiconductor die 110 and a semiconductor die 120. As shown in FIG. 1, the interposer 130 is attached to the substrate 150 through a plurality of first bumps 112. In particular, a first side of the interposer 130 is coupled to the substrate 150 through the plurality of first bumps 112. Furthermore, there may be a first underfill material layer 140 between the interposer 130 and the substrate 150.

FIG. 1 further illustrates the first semiconductor die 110 and the semiconductor die 120 are attached to a second side of the interposer 130 through a plurality of second bumps 107. Similarly, there may be a second underfill material layer 160 between the semiconductor dies (e.g., semiconductor die 110) and the interposer 130. The active circuits (not shown) of the first semiconductor die 110 and the second semiconductor die 120 are coupled to the substrate 150 through a conductive path formed by a first redistribution layer 106, the second bumps 107, a second redistribution layer 108, a plurality of through vias (e.g., through via 132), third redistribution layers (e.g., redistribution layer 122) and the first bumps 112.

Figure 2:
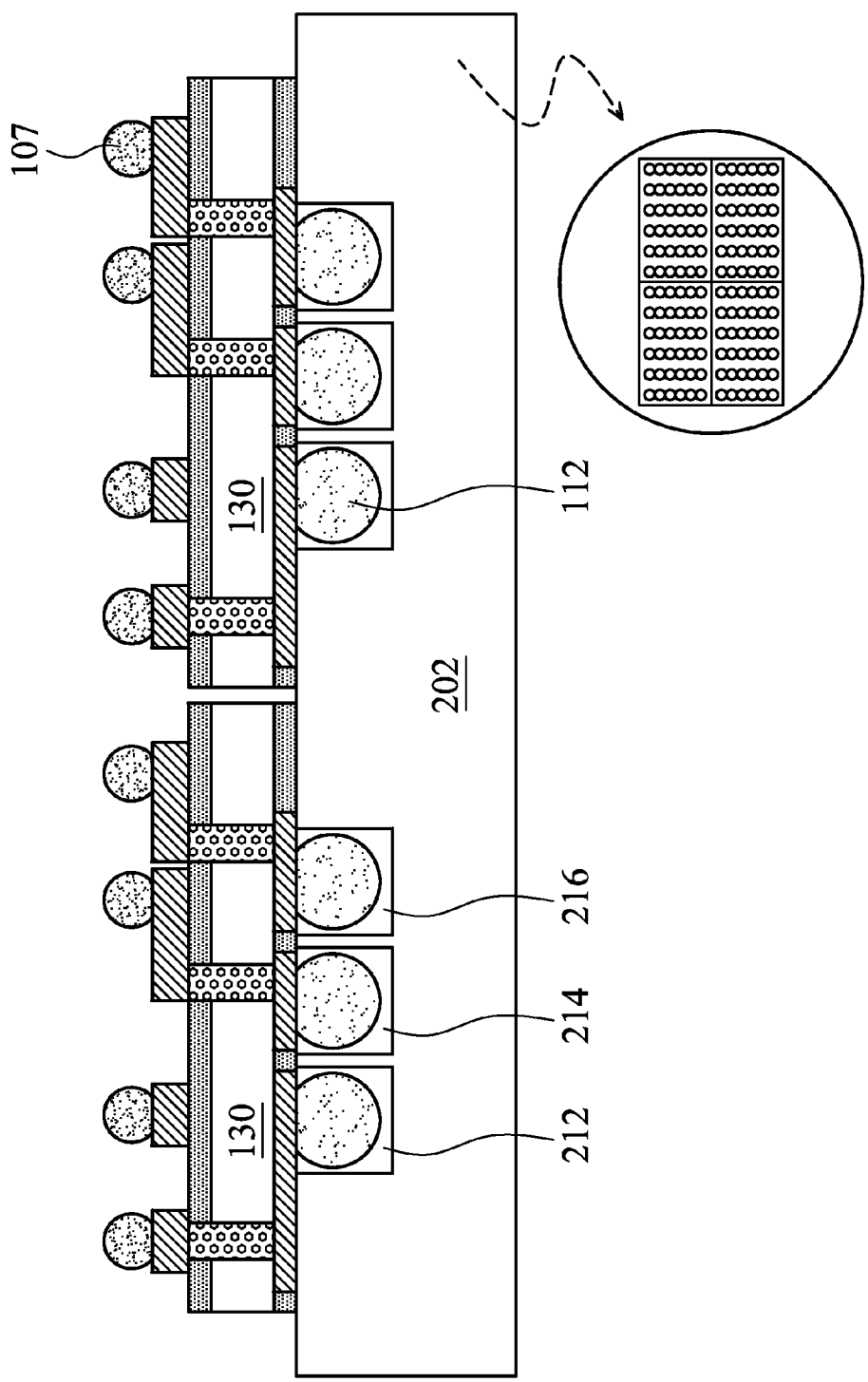
FIG. 2 illustrates a cross sectional view of a plurality of interposers on a carrier wafer.

FIGS. 2-5 are cross sectional views of intermediate stages in the making of the wafer stack 100 shown in FIG. 1 in accordance with an embodiment. FIG. 2 illustrates a cross sectional view of the interposers 130 on a carrier wafer 202. In accordance with an embodiment, the carrier wafer 202 is formed of silicon, glass or the like. The cavities (e.g., cavity 212) in the carrier wafer 202 are formed by suitable techniques such as wet etching, dry etching and/or the like. It should be noted that while the openings of the cavities shown in the top view of the carrier wafer 202 are substantially circular in shape. It is within the scope and spirit of various embodiments for the cavities to comprise other shapes, such as, but no limited to, oval, square, or rectangular.

As shown in the top view of the carrier wafer 202, there may be a plurality of cavities in the carrier wafer 202. The cavities (e.g., cavity 212) are configured such that each cavity is aligned with its corresponding first bump on the first side of the interposers 130. In addition, the opening of each cavity is slightly larger than the diameter of its corresponding bump so that the bump can be placed inside the cavity. In accordance with an embodiment, the distance between the interior wall of the cavity and the first bump is in a range from 10 um to 20 um. Furthermore, the cavities in the carrier wafer 202 have a depth of 120 um. As shown in FIG. 2, the carrier wafer 202 can provide a support, which holds the interposers 130 during subsequent fabrication processes.

The interposer 130 may include the first bumps 112 on the first side and the second bumps 107 on the second side after a plurality of bump reflow processes. The process of attaching bumps on both sides of an interposer is well known in the art, and hence is not discussed in further detail. After the reflow processes, the interposer 130 is picked and placed on the carrier wafer 202. As shown in FIG. 2, each first bump is aligned with a corresponding cavity and placed into the corresponding cavity. As a result, each first bump of the interposer 130 is encircled by the interior wall of its corresponding cavity.

Figure 3:
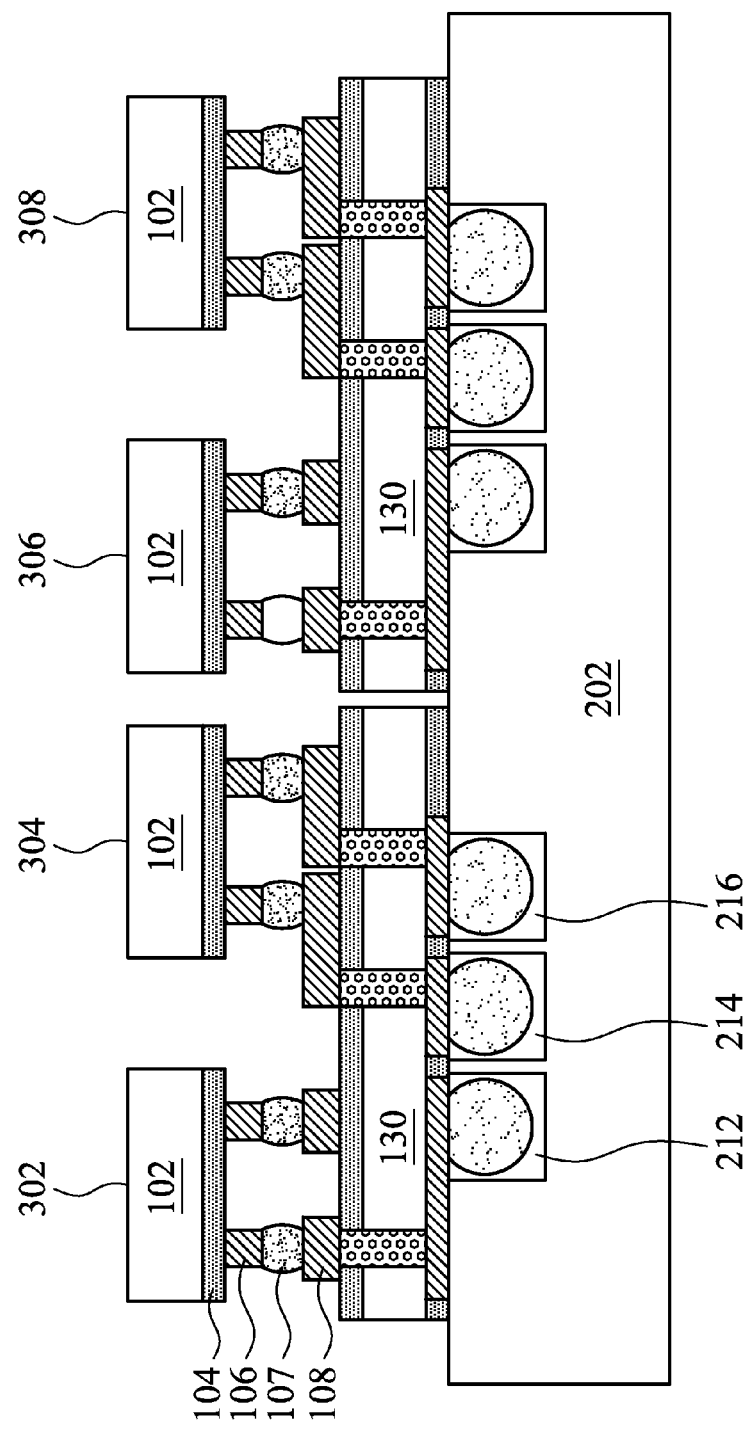
FIG. 3 illustrates a plurality of semiconductor dies bonded on top of the interposers in accordance with an embodiment.

FIG. 3 illustrates a plurality of semiconductor dies bonded on top of the interposers in accordance with an embodiment. A plurality of semiconductor dies (e.g., semiconductor die 302) are picked and placed on top of the interposer 130. After a reflow process, the semiconductor die are bonded on the interposer 130 through the bumps 107 between the interposer 130 and the semiconductor dies (e.g., semiconductor die 302). The detailed processes of bonding semiconductor dies on an interposer are well known in the art, and hence are not discussed herein.

As shown in FIG. 3, four semiconductor dies 302, 304, 306 and 308 have a substantially identical structure. For simplicity, only the structure of the first semiconductor die 302 is described in detail below. It should be noted that in order to give a basic insight of the inventive aspects of various embodiments, the first semiconductor die 302, the second semiconductor die 304, the third semiconductor die 306 and the fourth semiconductor die 308 are drawn without details. However, it should be noted that the first semiconductor die 302, the second semiconductor die 304, the third semiconductor die 306 and the fourth semiconductor die 308 may comprise basic semiconductor layers such as active circuit layers, substrate layers, inter-layer dielectric (ILD) layers and inter-metal dielectric (IMD) layers (not shown).

As shown in FIG. 3, the first semiconductor die 302 comprises a substrate 102. The substrate 102 may be a silicon substrate. Alternatively, the substrate 102 may be a silicon-on-insulator substrate. The substrate 102 may further comprise a variety of electrical circuits (not shown). The electrical circuits formed on the substrate 102 may be any type of circuitry suitable for a particular application.

In accordance with an embodiment, the electrical circuits may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like. One of ordinary skill in the art will appreciate that the above examples are provided for illustrative purposes only to further explain applications of the present disclosure and are not meant to limit the present disclosure in any manner.

An isolation layer 104 is formed on the substrate 102. The isolation layer 104 may be formed, for example, of a low-K dielectric material, such as silicon oxide. The isolation layer 104 may be formed by any suitable method known in the art, such as spinning, chemical vapor deposition (CVD) and plasma enhanced chemical vapor deposition (PECVD). It should also be noted that one skilled in the art will recognize that the isolation layer 104 may further comprise a plurality of dielectric layers.

A redistribution layer (RDL) 106 is formed on the isolation layer 104. The active circuit layer (not shown) of the first semiconductor die 110 may be bridged by the RDL layer 106 so that the active circuit layer of the first semiconductor die 302 can be coupled to the input and output (I/O) terminals of the semiconductor die 302. A plurality of under bump metal (UBM) structures (not shown) may be formed on the RDL layer 106. The UBM structures may help to prevent diffusion between the interconnection bumps (e.g., second bumps 107) and the integrated circuits of the first semiconductor die 302, while providing a low resistance electrical connection. The interconnection bumps (e.g., second bumps 107) provide an effective way to connect the first semiconductor die 302 with the interposer 130. The interconnection bumps are I/O terminals of the first semiconductor die 302. In accordance with an embodiment, the interconnection bumps (e.g., second bumps 107) may be a plurality of solder balls. Alternatively, the interconnection bumps (e.g., second bumps 107) may be a plurality of land grid array (LGA) pads.

After the semiconductor dies (e.g., semiconductor die 302) are bonded on the interposer 130, the active circuits of the semiconductor dies (e.g., first semiconductor die 302) are coupled to the bumps (e.g., bump 212) of the interposer 130 through a conductive channel formed by the RDL layers on the interposer 130 (e.g., RDL layer 108), the interconnection bumps connected between the interposer 130 and the semiconductor dies (e.g., first semiconductor die 302).

Figure 4:
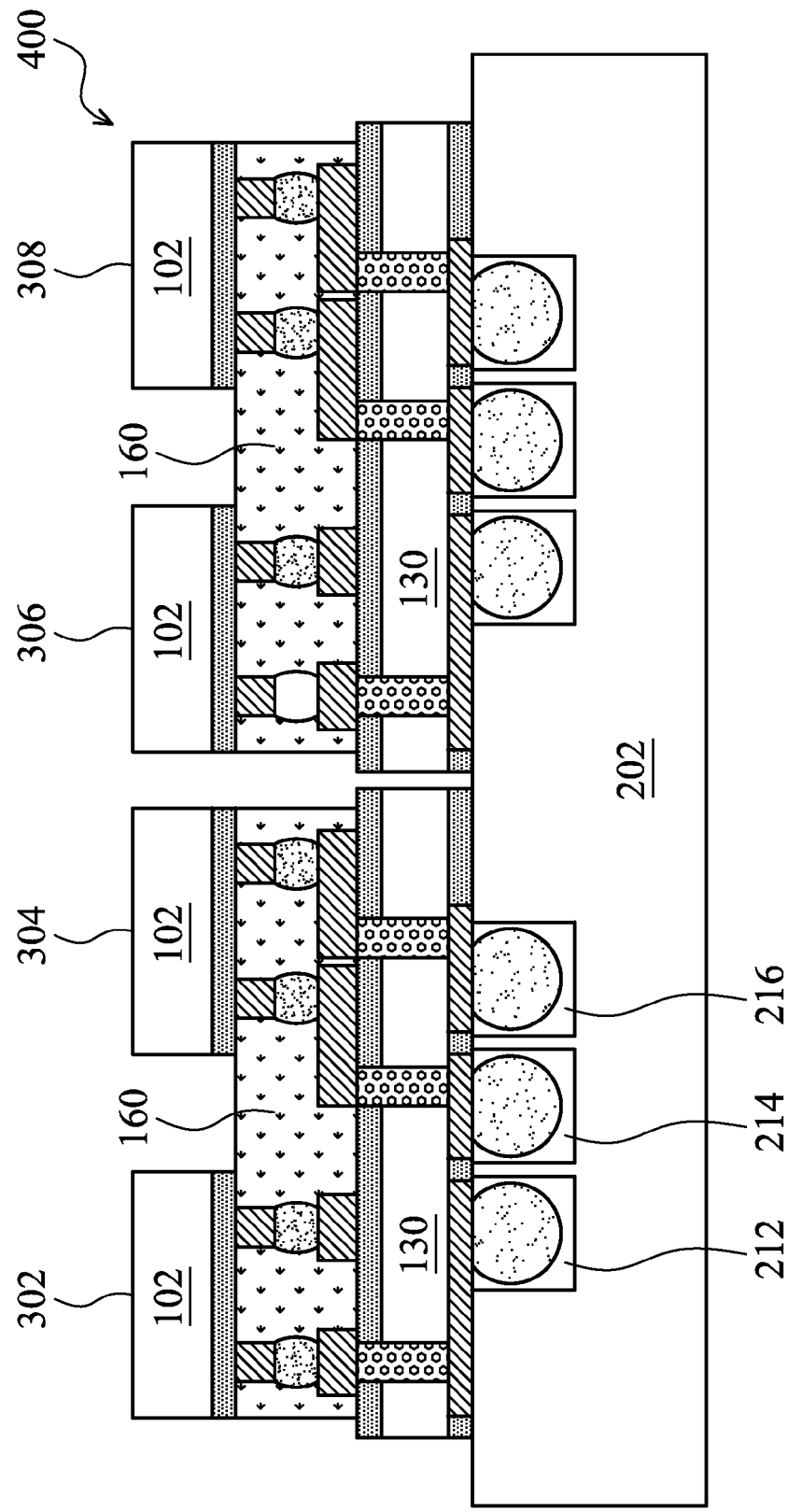
FIG. 4 illustrates a cross sectional view of a wafer stack having an underfill material layer formed between a plurality of semiconductor dies and a plurality of interposers.

FIG. 4 illustrates a cross sectional view of a wafer stack having an underfill material layer formed between the semiconductor dies and the carrier wafer. An underfill material layer 160 may be formed in the gap between the interposer 130 and the plurality of semiconductor dies (e.g., the first semiconductor die 302) mounted on top of the interposer 130. In accordance with an embodiment, the underfill material 160 may be an epoxy, which is dispensed at the gap between the interposer 130 and the semiconductor dies (e.g., the first semiconductor die 302). The epoxy may be applied in a liquid form, and may harden after a curing process.

In accordance with another embodiment, the underfill material layer 160 may be formed of curable materials such as polymer based materials, resin based materials, polyimide, epoxy and any combinations of thereof. The underfill material layer 160 can be formed by a spin-on coating process, dry film lamination process and/or the like. An advantageous feature of having an underfill material (e.g., underfill material 160) is that the underfill material 160 helps to prevent the wafer stack 400 from cracking during thermal cycling processes. In addition, another advantage feature is that the underfill material 160 may help to reduce the mechanical and thermal stresses during the fabrication process of the wafer stack 400.

Figure 5:
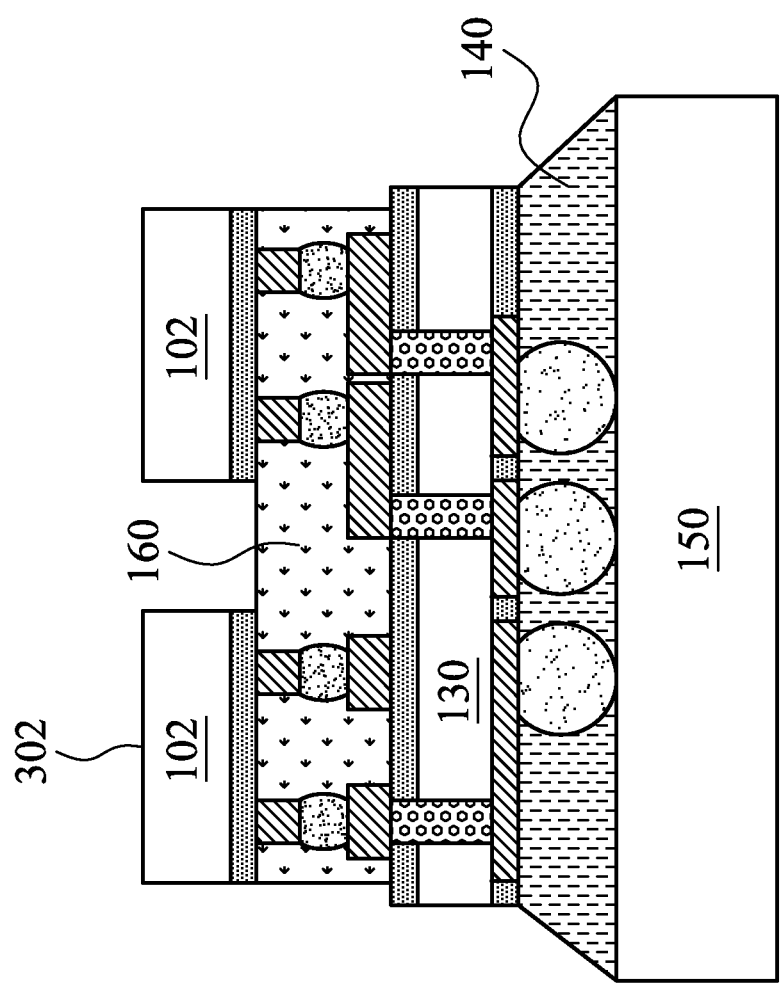
FIG. 5 illustrates a process of stacking a wafer stack on a substrate in accordance with an embodiment.

FIG. 5 illustrates a process of stacking a wafer stack on a substrate in accordance with an embodiment. The wafer stack 400 shown in FIG. 4 is detached from the carrier wafer 202 and further bonded on a substrate 150 through another reflow process. Subsequently, a second underfill material layer 140 is formed between the interposer 130 and the substrate 150. The formation of the underfill material layer 140 is similar to that of the underfill material layer 160, and hence is not discussed in further detail herein.

As shown in FIG. 5, after the wafer stack 400 are bonded on the substrate 150, the active circuits of the semiconductor dies (e.g., first semiconductor die 302) are coupled to the substrate 150 through a conductive channel formed by the RDL layers on the semiconductor die, the interconnection bumps connected between the interposer 130 and the semiconductor die 302, the RDL layers on the interposer 130, the through vias in the interposer 130 and bumps between the interposer 130 and the substrate 150.

Figure 6:
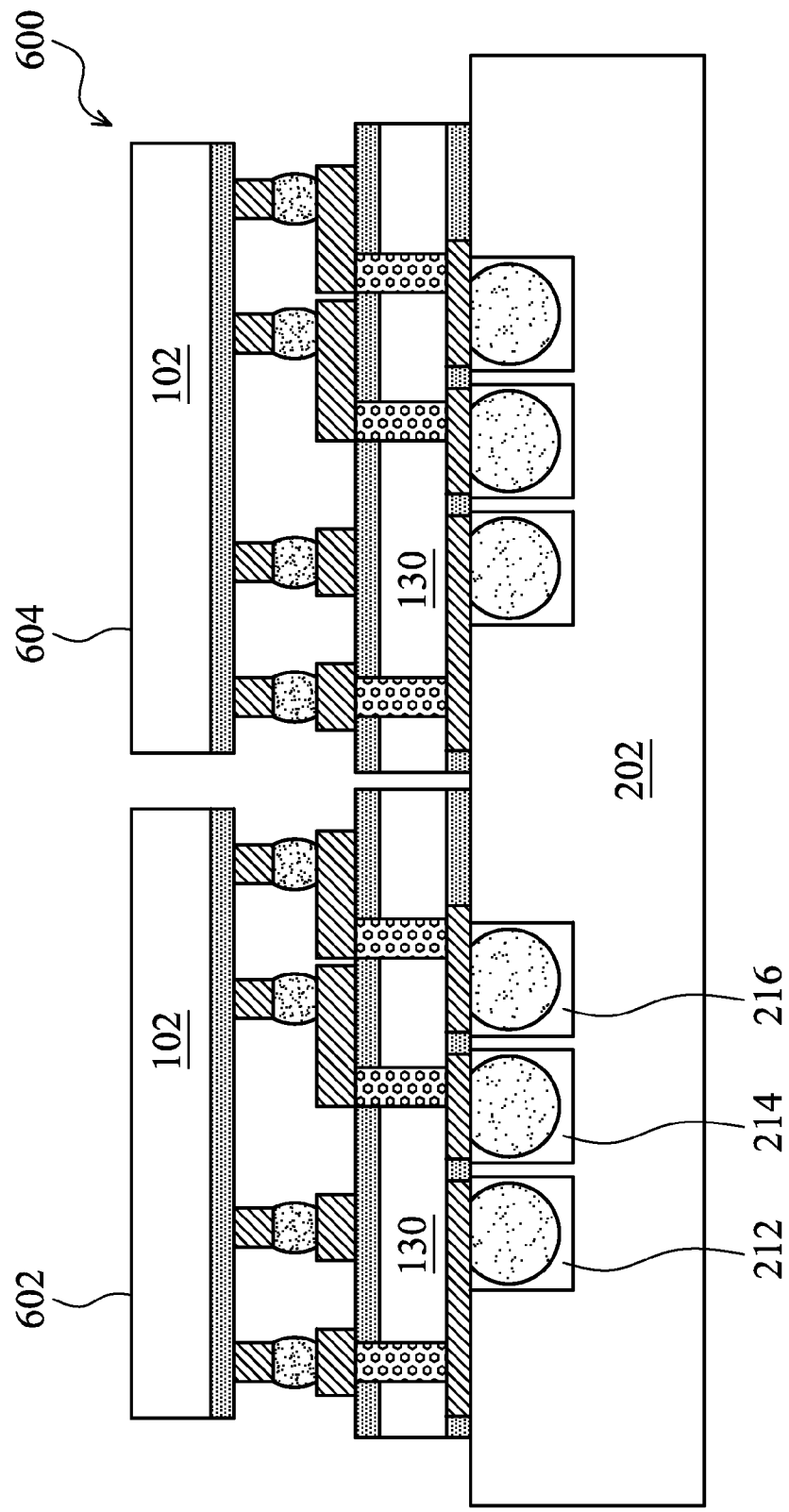
FIGS. 6-8 are cross sectional views of intermediate stages in the making of a wafer stack in accordance with another embodiment.
Figure 7:
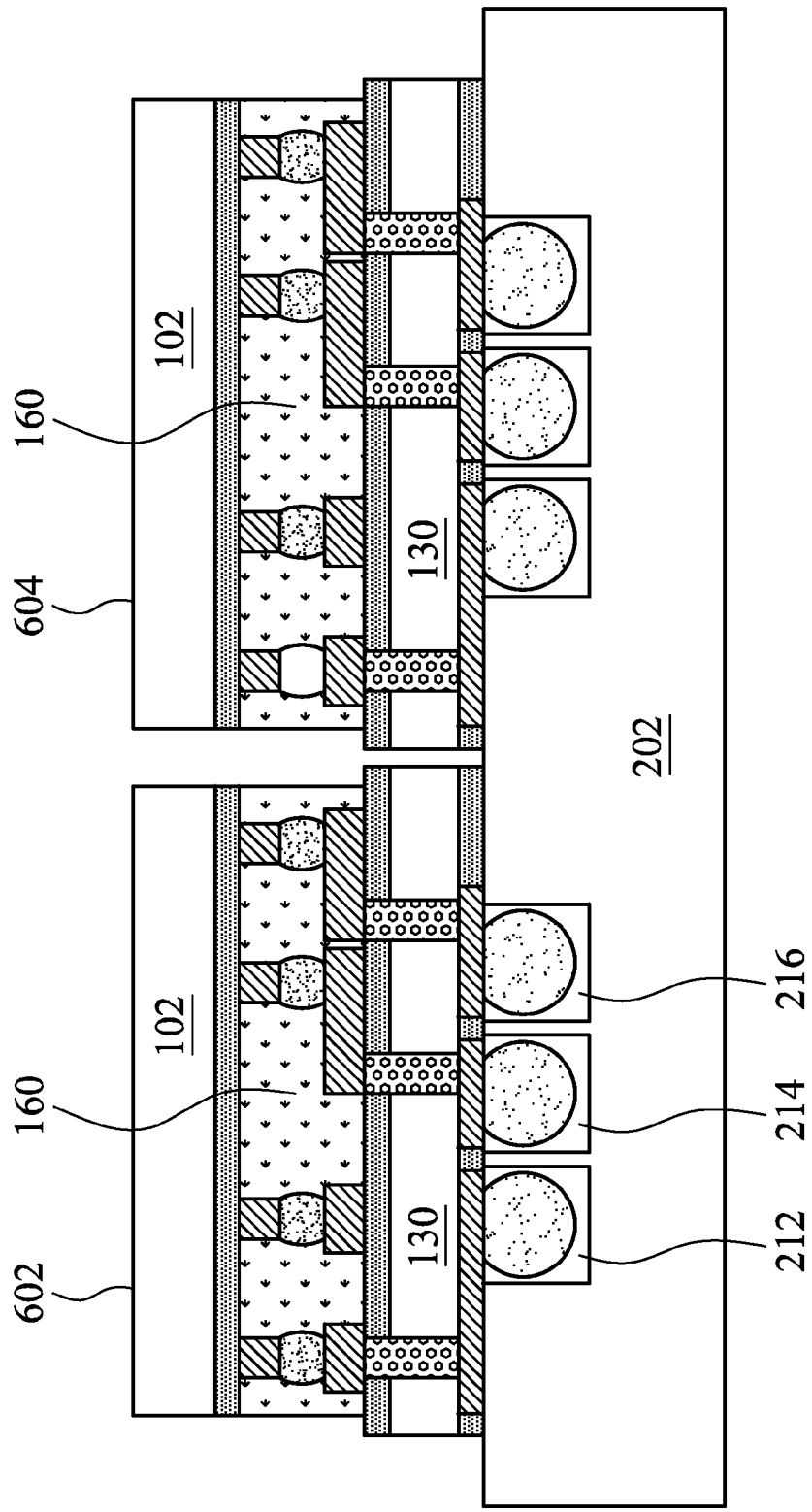
Figure 8:
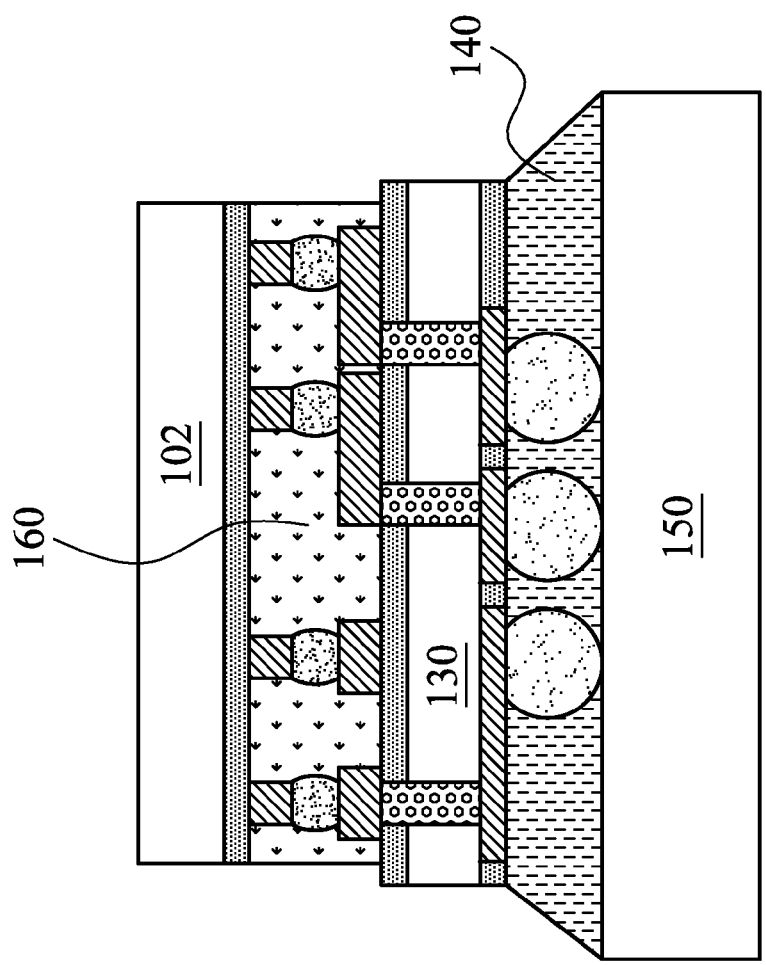
Figure 9:
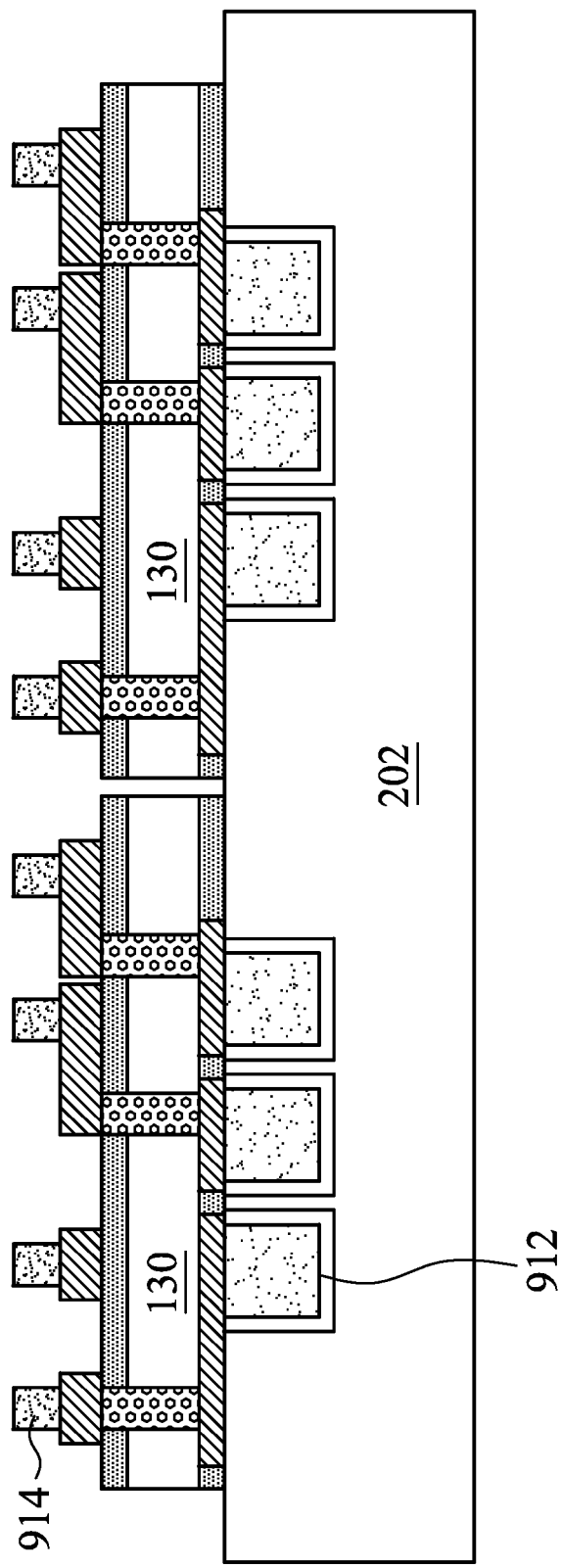
FIGS. 9-12 are cross sectional views of intermediate stages in the making of a wafer stack in accordance with yet another embodiment.

FIGS. 6-8 are cross sectional views of intermediate stages in the making of a wafer stack in accordance with another embodiment. FIGS. 6-8 are similar to FIGS. 3-5 except that there may be one semiconductor die (e.g., semiconductor die 602) bonded on the interposer 130. The process of forming the wafer stack 600 is similar to that of forming the wafer stack 100, and hence is not discussed in further detail to avoid unnecessary repetition. The process procedures of forming the underfill material layer 160, attaching the wafer stack 600 to a substrate 150 and forming the underfill material layer 140 have been described with respect to FIGS. 3-5, and hence are not discuss again to avoid repetition.

Figure 10:
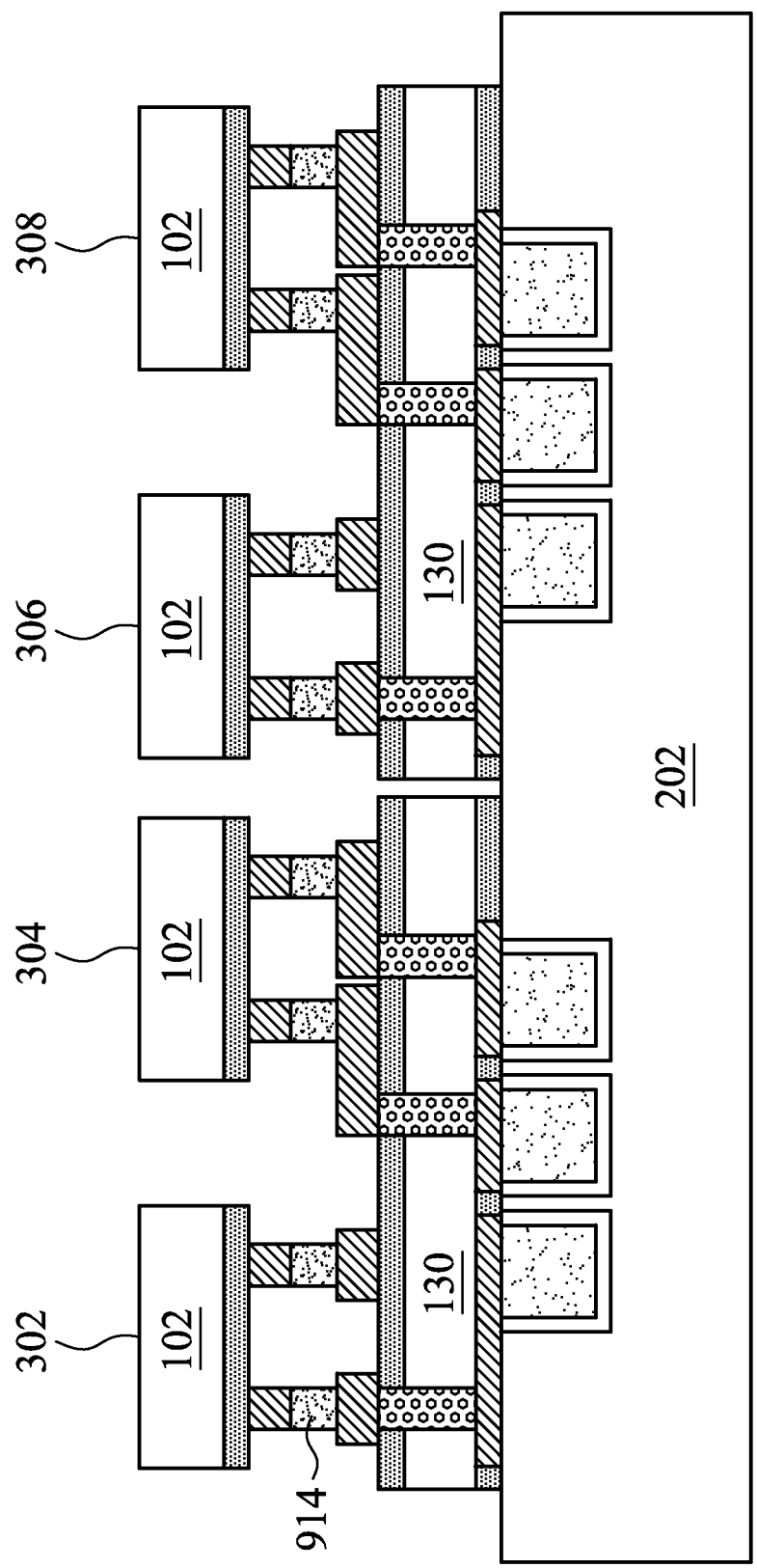
Figure 11:
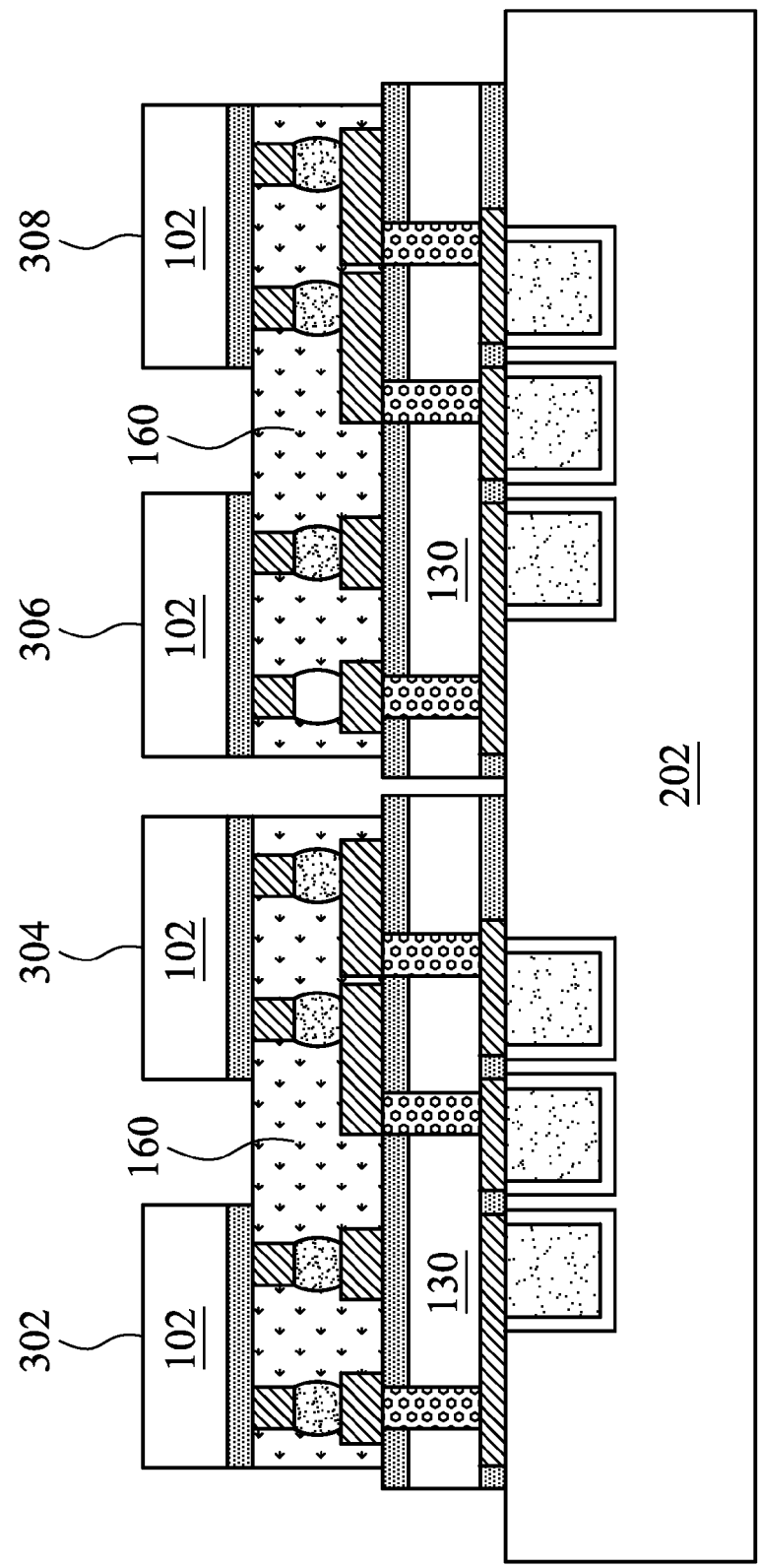
Figure 12:
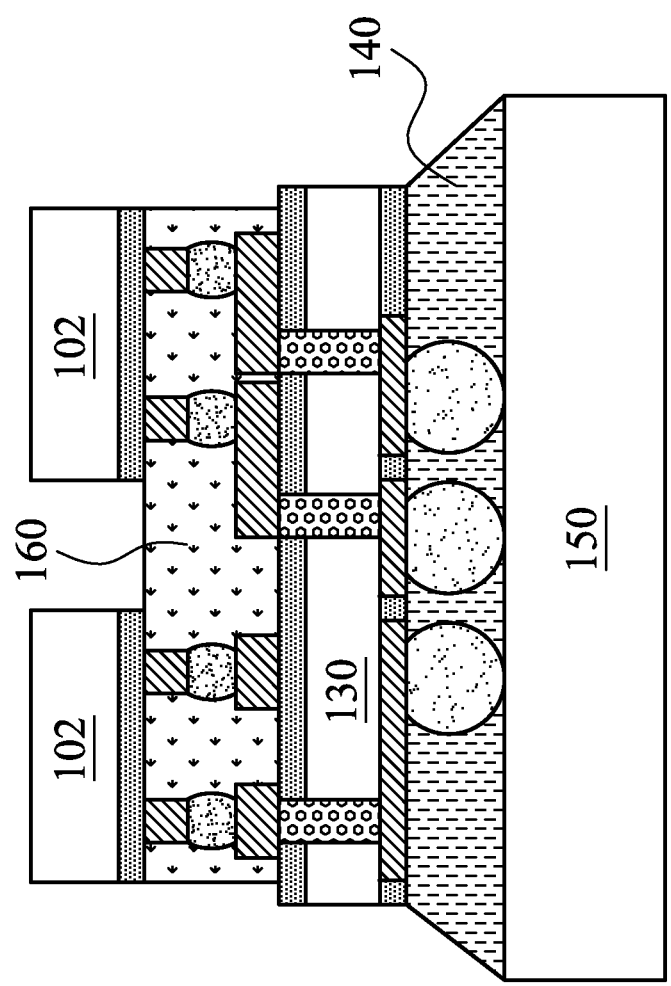

FIGS. 9-12 are cross sectional views of intermediate stages in the making of a wafer stack in accordance with yet another embodiment. FIGS. 9-12 are similar to FIGS. 2-5 except that the bumps on both sides of the interposer 130 (e.g., bump 912 and bump 914) have not been through a bump reflow before the interposer 130 is placed on top of the carrier wafer 202. In order to prevent semiconductor dies from sliding on the circular shaped bumps (e.g., bump 107 shown in FIG. 2), an interposer not having a bump reflow is employed to keep the semiconductor dies from sliding on the interposer. As shown in FIG. 10, the square shaped bumps (e.g., bump 914) help to hold the semiconductor dies. The process procedures of forming the underfill material layer 160, attaching the wafer stack to a substrate 150 and forming the underfill material layer 140 have been described with respect to FIGS. 3-5, and hence are not discuss again to avoid repetition.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
receiving a carrier wafer having a plurality of cavities formed in the carrier wafer;
receiving an interposer comprising
a plurality of first bumps on a first side of the interposer; and
a plurality of second bumps on a second side of the interposer, wherein each of the first bumps and second bumps respectively has a circular shape;
attaching the interposer to the carrier wafer, wherein the first bumps are configured such that each first bump is located in a corresponding cavity in the carrier wafer, and wherein the first bumps are configured to maintain a gap between interior walls of a cavity and exterior walls of a corresponding first bump;
attaching a semiconductor die on the second side of the interposer to form a wafer stack; and
attaching the wafer stack to a substrate.

2. The method of claim 1, further comprising:
forming a first underfill layer between the interposer and the semiconductor die.

3. The method of claim 1, further comprising:
forming a second underfill layer between the interposer and the substrate.

4. The method of claim 1, wherein the interposer comprises:
a plurality of through vias in the interposer.

5. The method of claim 4, wherein the interposer comprises:
a first redistribution layer on the first side of the interposer; and
a second redistribution layer on the second side of the interposer, wherein the first bumps are connected to respective through vias through the first redistribution layer and the second bumps are connected to respective through vias through the second redistribution layer.

6. The method of claim 5, further comprising:
forming from the semiconductor die to the substrate a conductive path including the first bumps, the first redistribution layer, the through vias, the second redistribution layer and the second bumps.

7. The method of claim 1, further comprising:
detaching the wafer stack from the carrier wafer.

8. The method of claim 1, wherein the cavities correspond to patterns of the first bumps of the interposer.

9. A method comprising:
receiving a carrier wafer having a plurality of cavities formed in the carrier wafer;
receiving an interposer comprising
a plurality of first bumps on a first side of the interposer; and
a plurality of second bumps on a second side of the interposer, wherein each of the first bumps and second bumps respectively has a rectangular shape;
attaching the interposer to the carrier wafer, wherein the first bumps are configured such that each first bump is located in a corresponding cavity in the carrier wafer, and wherein the first bumps are configured to maintain a gap between interior walls of a cavity and exterior walls of a corresponding first bump;
attaching a semiconductor die on the second side of the interposer to form a wafer stack with a first reflow process; and
attaching the wafer stack to a substrate with a second reflow process.

10. The method of claim 9, further comprising:
bonding the semiconductor die to the interposer; and
forming a first underfill layer between the interposer and the semiconductor die.

11. The method of claim 9, further comprising:
bonding the wafer stack to the substrate; and
forming a second underfill layer between the interposer and the substrate.

12. The method of claim 9, further comprising:
forming a plurality of through vias in the interposer;
attaching the first bumps to the first side of the interposer; and
attaching the second bumps to the second side of the interposer.

13. The method of claim 12, further comprising:
forming a first redistribution layer on the first side of the interposer; and
forming a second redistribution layer on the second side of the interposer, wherein the first bumps are connected to respective through vias through the first redistribution layer and the second bumps are connected to respective through vias through the second redistribution layer.

14. The method of claim 13, further comprising:
forming from the semiconductor die to the substrate a conductive path including the first bumps, the first redistribution layer, the through vias, the second redistribution layer and the second bumps.

15. The method of claim 9, further comprising:
detaching the wafer stack from the carrier wafer.

16. The method of claim 9, further comprising:
patterning the carrier wafer to form the cavities according to a pattern of the first bumps of the interposer.

17. A method comprising:
attaching an interposer to a carrier wafer having a plurality of cavities, wherein the interposer comprises:
a plurality of first bumps on a first side of the interposer, wherein each of the first bumps is located in a corresponding cavity in the carrier wafer, and wherein the first bumps are configured to maintain a gap between interior walls of a cavity and exterior walls of a corresponding first bump; and
a plurality of second bumps on a second side of the interposer;
attaching a semiconductor die on the second side of the interposer to form a wafer stack with a first reflow process; and
attaching the wafer stack to a substrate with a second reflow process.

18. The method of claim 17, further comprising:
configuring the carrier wafer such that:
each cavity is larger than its corresponding bump; and
each bump fits into its corresponding cavity.

19. The method of claim 17, further comprising:
forming a plurality of through vias in the interposer;
forming a first redistribution layer on the first side of the interposer;
forming a second redistribution layer on a second side of the interposer;
forming a plurality of second bumps on the second side of the interposer; and
forming a third redistribution layer on the first side of the semiconductor die, wherein the third redistribution layer, the second bumps, the second redistribution layer, the first redistribution layer and the through vias form a conductive path.

20. The method of claim 17, further comprising an underfill material layer formed between the semiconductor die and the interposer.

* * * * *